United States Patent
Fang et al.

(10) Patent No.: US 8,228,726 B2
(45) Date of Patent: Jul. 24, 2012

(54) N-CHANNEL SONOS NON-VOLATILE MEMORY FOR EMBEDDED IN LOGIC

(75) Inventors: Gang-Feng Fang, Fremont, CA (US); Wingyu Leung, Cupertino, CA (US)

(73) Assignee: Chip Memory Technology, Inc., San Jose, CA (US)

( * ) Notice: Subject to any disclaimer, the term of this patent is extended or adjusted under 35 U.S.C. 154(b) by 0 days.

(21) Appl. No.: 12/906,153

(22) Filed: Oct. 18, 2010

(65) Prior Publication Data

US 2011/0032766 A1 Feb. 10, 2011

Related U.S. Application Data

(63) Continuation-in-part of application No. 12/334,510, filed on Dec. 14, 2008, now Pat. No. 7,983,081.

(51) Int. Cl.
*G11C 16/04* (2006.01)
*H01L 29/788* (2006.01)
*H01L 21/336* (2006.01)

(52) U.S. Cl. ............ 365/185.01; 365/185.18; 257/315; 257/316; 438/258

(58) Field of Classification Search ............. 365/185.01
See application file for complete search history.

(56) References Cited

U.S. PATENT DOCUMENTS

| | | | |
|---|---|---|---|
| 5,907,171 A * | 5/1999 | Santin et al. | 257/315 |
| 6,037,222 A * | 3/2000 | Huang et al. | 438/257 |
| 6,265,739 B1 * | 7/2001 | Yaegashi et al. | 257/296 |
| 6,287,907 B1 * | 9/2001 | Ito et al. | 438/201 |
| 6,329,240 B1 * | 12/2001 | Hsu et al. | 438/253 |
| 6,489,202 B1 | 12/2002 | Hsu et al. | |
| 6,750,504 B2 | 6/2004 | Yang et al. | |
| 6,788,574 B1 * | 9/2004 | Han et al. | 365/185.08 |
| 6,815,755 B2 * | 11/2004 | Colclaser et al. | 257/314 |
| 7,118,963 B2 * | 10/2006 | Mori | 438/257 |
| 7,388,250 B2 * | 6/2008 | Chen et al. | 257/315 |
| 7,400,538 B2 * | 7/2008 | Pikhay et al. | 365/185.29 |
| 7,522,456 B2 * | 4/2009 | Fang et al. | 365/185.28 |
| 7,538,376 B2 * | 5/2009 | Hashimoto et al. | 257/314 |
| 7,547,944 B2 * | 6/2009 | Georgescu et al. | 257/326 |
| 7,983,081 B2 * | 7/2011 | Fang et al. | 365/185.08 |
| 7,986,015 B2 * | 7/2011 | Ema et al. | 257/390 |
| 2003/0147277 A1 * | 8/2003 | Hsu | 365/185.01 |
| 2003/0200406 A1 * | 10/2003 | Kouno | 711/164 |
| 2004/0004894 A1 * | 1/2004 | Shukuri et al. | 365/222 |

(Continued)

OTHER PUBLICATIONS

Lee, H.M. et al.., "NeoFlash—True Logic Single Poly Flash Memory Technology" by, IEEE Non-volatile Memory Workshop 2006, pp. 15-16, May 15, 2006. (Last Visited Oct. 18, 2010).

(Continued)

*Primary Examiner* — Son Mai
(74) *Attorney, Agent, or Firm* — Raj Abhyanker, P.C.

(57) ABSTRACT

A system and method of an electrically programmable and erasable non-volatile memory cell fabricated using a single-poly, logic process with the addition of ONO deposition and etching is disclosed. In one embodiment, a non-volatile memory system includes at least one non-volatile memory cell consists of a SONOS transistor fabricated on a P substrate, with a deep N-well located in the P substrate, with a P-well located in the deep N-well. The memory cell further includes an access NMOS transistor, coupled to the SONOS transistor and located in the same P-well that includes an oxide only gate-dielectric. The cell can be fabricated in a modified logic process with other transistors and with their physical characteristics preserved.

29 Claims, 18 Drawing Sheets

U.S. PATENT DOCUMENTS

| | | | |
|---|---|---|---|
| 2006/0118854 A1* | 6/2006 | Lee | 257/315 |
| 2007/0196982 A1 | 8/2007 | Eitan | |
| 2009/0003074 A1* | 1/2009 | Georgescu et al. | 365/185.18 |

OTHER PUBLICATIONS

Bu, Jiankang et al., "Design Considerations in Scaled SONOS Nonvolatile Memory Devices," Sherman Fairchild Laboratory, 16A Memorial Dr. E., Lehigh University, Bethlehem, PA 18015, 2000. http://klabs.org/richcontent/MemoryContent/nvmt_symp/nvmts_2000/papers/bu.pdf; (Last Visited Oct. 18, 2010).

Adams, Dennis, et al., "SONOS Nonvolatile Semiconductor Memories for Space and Military Applications," 2000. http://klabs.org/richcontent/MemoryContent/nvmt_symp/nvmts_2000/papers/adams_d.pdf; (Last Visited Oct. 18, 2010).

Ahn, J-H at al., "An Experimental 256Mb Non-volatile DRAM with Cell Plate Boosted Programming Technique," by JSSC, 2004. (Last Visited Oct. 18, 2010).

Breitwisch, M. J., "A Novel CMOS Compatible Embedded Nonvolatile Memory with Zero Process Adder," Proceedings of the 2005 IEEE International Workshop on Memory Technology, 2005. (Last Visited Oct. 18, 2010).

\* cited by examiner

MEMORY ARRAY BIAS VOLTAGE

| | CELL | P_WELL | BL1 | COM | BL2 | CG1 | CG2 |
|---|---|---|---|---|---|---|---|
| PROGRAM | 221, 222 | -5 V | -5 V | -5 V | -5 V | 0 V | 5 V |
| ERASE | 222 | -1 V | -1 V | -1 V | 5 V | 0 V | -3 V |
| READ | 221, 222 | 0 V | 1.5 V | 0 V | 1.5 V | 0 V | 1.5 V |

MEMORY ARRAY BIAS VOLTAGE

| FUNCTION | CELL | CG1 | CG0 | WL1 | WL0 | COM | BL1 | BL0 |
|---|---|---|---|---|---|---|---|---|
| PROGRAM | ROW 0 | 0 V | 5 V | 0 V | 1.5 V | -5 V | -5 V | -5 V |
| ERASE | CELL 400 | -2 V | -4 V | -2 V | 5 V | -2 V | 0 V | 4 V |
| READ | ROW 0 | 1.5 V | 1.5 V | 0 V | 1.5 V | 0 V | 1.5 V | 1.5 V |

FIGURE 7

N-CHANNEL SONOS NON-VOLATILE MEMORY FOR EMBEDDED IN LOGIC

CLAIM OF PRIORITY

This application is a continuation in part application and claims priority from U.S. utility application Ser. No. 12/334,510 titled "NON-VOLATILE MEMORY APPARATUS AND METHOD WITH DEEP N-WELL" filed on Dec. 14, 2008.

FIELD OF TECHNOLOGY

This disclosure relates generally to non-volatile memory. More particularly, this invention relates to an electrically programmable and erasable non-volatile memory cell for embedded application with logic circuits. The embedded non-volatile memory is fabricated using a process modified from a generally available single-poly logic process.

BACKGROUND

As semi-conductor processes continue to scale, the number of transistors available in a silicon-chip increases. Integrating the whole system on a chip becomes a possibility for many applications. However, most systems are composed of many separate components such as DRAM, EEPROM, and FLASH which are fabricated using specialized processes. These processes may not be compatible with the common logic process used for manufacturing logic components such as microprocessors and system logic.

Common logic or application-specific-integrated-circuit (ASIC) processes are typically the most aggressively scaled processes offered by silicon foundries. In order to integrate specialized memory components (e.g., EEPROM, DRAM and FLASH) on the same substrate as logic components, processing steps may need to be added to a logic process. However, adding steps to logic manufacturing processes adds to the manufacturing cost of all the components of the chip, including the logic components that wouldn't otherwise use those steps.

Alternatively, memory circuits can be designed to be compatible with the logic process. However, the memory cell area fabricated from the logic process is generally bigger, e.g., three times or more, than the area of memory cell fabricated with added processing. Therefore, it is desirable to fabricate non-volatile memory for embedded in logic process with minimum additional processing steps to reduce cell area without incurring much additional cost to the logic process.

The common logic processes offered by silicon foundries with feature sizes in a very deep submicron (e.g., 130 nm and 90 nm) area may include the following characteristics: 1) single-layer poly-silicon ("single-poly); and 2) transistors with thin oxide for the logic circuits operating at a lower supply voltage (e.g., 1.0 v) and transistors with thick oxide for handling higher IO voltages (for example 3.3 v).

However, non-volatile memory can require voltage levels higher than those used by traditional transistors fabricated using a generally available logic process. High voltage transistors can be fabricated using a specialized logic process, but this requires extra cost and steps. Therefore the non-volatile memories are not suitable for embedded applications using commonly available logic processes.

SUMMARY

The present invention provides an electrically programmable and erasable non-volatile memory cell fabricated using a process modified from a single-poly, logic process with either deep N-well in a P-substrate or directly in an N-substrate. The modification uses one additional gate-dielectric mask to incorporate an Oxide-Nitride-Oxide (ONO) dielectric structure in the gate of the tunneling transistor of the memory cell for charge trapping. The mask is used for the formation of the gate-dielectric of SONOS (Silicon-oxide-nitride-oxide-silicon) transistors for the memory and it does not affect the gate structure and electrical characteristics of other transistors and devices fabricated on the same substrate. Accordingly, the addition of ONO deposition and etching with the use of one additional mask minimizes the additional cost of the base line logic process but provides the benefit of integrating non-volatile memories in a chip together with logic circuits.

The embedded non-volatile memory of the present invention uses n-channel SONOS transistors in a P-well. When fabricated in a P-substrate, a Deep N-well is used to isolate the memory cells from the other devices fabricated in the same substrate. However, when fabricated in an N-substrate, the P-well facilitates the electrical isolation and the non-volatile memory can be fabricated directly in the N-substrate. A similar P-well in a deep N-well may be used to isolate analog circuit or noise sensitive circuits so that the back gate of the NMOS devices can be isolated from the substrate and thus the substrate noise.

Generally the program and erase operation of a SONOS-type non-volatile memory using NMOS transistors requires high voltages of approximately 10V and −10V respectively. For example, during program and erase using F-N tunneling, respectively a voltage potential of approximately 10V and −10V is required between control gate and the channel region. In a logic process, the IO transistors, which have the highest voltage limit among all the transistors, have voltage limits of approximately +/−5V. The 10V across the gate and source/drain can be accomplished by connecting the control gate to a 5V source and the source or drain to the −5V. Similarly, the −10V erase voltage is accomplished by splitting the voltage so that the control gate is connected to a −5V supply and the drain or source is connected to a 5V supply. In a P-substrate P-well of all transistors are electrically connected to the substrate which is usually coupled to a ground potential. A −5V supply coupled to the bulk or P-well of any device will create a short between the −5V supply and ground. A deep N-well is therefore used to isolate the P-well of the memory cells from the substrate and allow the bulk of the memory transistors to couple to a potential more negative than ground. When the substrate is N-type instead of P-type, the deep N-well is no longer required as the P-well, on which the memory cell is disposed, can be disposed directly into the N-substrate. Coupling of a voltage to the P-well more negative than the potential on the N-substrate does not cause the P-well and N-substrate junction to be forward biased.

In the present embodiment, F-N tunneling is used to inject electrons into the nitride traps to increase the threshold voltage of the n-channel SONOS transistor of the memory cell during program operation and Band-to-band hot-hole injection (BBHHI) is used to inject holes into the nitride traps to decrease the threshold voltage of the tunneling transistor during erase operation. The use of BBHHI for erase allows faster erase time (100 to 500 us) compared to the erase time of F-N tunneling (1-10 ms). Another advantage of BBHHI over F-N tunneling is the lower operation voltage. For example, typical erase voltages of approximately −3V and +5V can be used in BBHHI erase in a 110 nm process compared with −5V and +5V used in F-N tunneling. In the present invention, the short erase time and low operating voltage characteristics of BBHHI in the present invention is further enhanced by the blocking of the lightly-doped (LDD) implant during the formation of the source and drain of SONOS transistor. The result is the formation of more abrupt source and drain junction.

The structure of the first embodiment of the memory cell using only one transistor is first described. Then the structure of the second embodiment of the memory cell using two transistors is described. Subsequently, the formation of a differential using two single cells is described. Finally, the added fabrication steps to a typical logic process for the embedded non-volatile memory are elaborated. The methods, systems, and apparatuses disclosed herein may be implemented in any means for achieving various aspects.

More particularly, in one embodiment, a non-volatile memory (NVM) cell embedded in common logic comprises: an n-doped layer of silicon; a P-well disposed on the n-doped layer; an NMOS transistor with an Oxide-Nitride-Oxide (ONO) gate dielectric disposed in the P-well, wherein the NMOS transistor comprises: a source; a drain; a channel region disposed between, or coupled to, the source and the drain; and a poly-silicon or metal control gate disposed on the ONO layer gate dielectric resulting in a SONOS or a MONOS transistor, respectively. Optionally, the NVM cell includes an under-lapped source region disposed between the channel region and the source; and an under-lapped drain region disposed between the channel region and the drain. The oxide-nitride-oxide gate dielectric is comprised of: a blocking oxide layer; underlying the control gate; a nitride layer underlying the blocking oxide layer, and a tunneling oxide layer underlying the nitride layer and overlying the P-well, e.g., the nitride layer is disposed between the tunneling oxide layer and the blocking oxide layer. The n-doped layer can either be a deep N-well which is disposed in a P-substrate or it can be an N-substrate. During a program operation of the NVM cell, the control gate is selectively coupled to a positive bias and the source or the drain is selectively coupled to a negative bias; where the positive and negative biases are less than, or equal to, a maximum voltage limit of the input/output (I/O) transistors used in common logic, or alternatively, of any transistors used in common logic or any transistors used in a common IC which has the highest voltage tolerance limit. During an erase operation, the control gate is selectively coupled to a negative bias and the source or the drain is selectively coupled to a positive bias, wherein the positive and negative bias are less than, or equal to, the a maximum voltage limit of either the input/output (I/O) transistors, or any transistors, used in common logic, or used in the integrated circuit (IC) which has the highest voltage tolerance limit. The NVM cell can optionally include an access transistor having a source that is coupled, or mated, to the drain of the SONOS transistor.

In another embodiment a non-volatile memory cell is prepared by a logic process comprising: creating an n-doped layer in a silicon substrate; creating a p-well in the n-doped layer; creating an NMOS transistor in the p-well, wherein the NMOS transistor includes a source and a drain on either side of a channel region; creating an Oxide-Nitride-Oxide (ONO) gate dielectric overlying the P-well; depositing a single-layer of poly-silicon or metal simultaneously on the gate dielectric of the non-volatile NMOS memory cell transistor and the on the gate dielectric of logic transistors simultaneously. The logic process for creating the NVM cell uses only a single additional mask, wherein one embodiment the additional mask is a gate-dielectric mask. The ONO gate dielectric is prepared by a process comprising: depositing a tunnel oxide layer overlying the P-well; depositing a nitride layer overlying the tunnel oxide layer; and depositing a blocking oxide layer overlying the nitride layer. Optionally, the deposition of lightly-doped diffusion can be blocked on either side of the channel region so as to create a more abrupt source and drain junction between the channel region and an N+ region of the source and between the channel region and an N+ region of the drain.

In yet another embodiment, a method of fabricating a non-volatile memory (NVM) cell comprises: creating an N-well in a P-type silicon substrate; creating a P-well in the N-well; creating an NMOS transistor in the P-well, wherein the NMOS transistor includes a source and a drain on either side of a channel region; creating an Oxide-Nitride-Oxide (ONO) gate dielectric overlying the P-well, e.g., disposed above the channel region; depositing a single-layer of poly-silicon or metal on the gate dielectric to form a gate for each of the transistors simultaneously. The method of fabricating the NVM cell uses a common logic process in one embodiment. The method of fabrication the NVM cell also fabricates common logic components on the same substrate as the non-volatile memory cell using at least the steps, or all the steps, required in a same common logic process, and in one embodiment, using only a single additional mask, wherein the single additional mask is a gate dielectric mask used for masking common logic components during the creation, or deposition, of the ONO gate dielectric. Optionally, the method of fabricating the NVM cell blocks a deposition of light dopant on either side of the channel region so as to create a more abrupt source and drain junction between the channel region and an N+ region of the source and between the channel region and an N+ region of the drain. The creation of the Oxide-Nitride-Oxide (ONO) gate dielectric comprises: depositing a tunnel oxide layer overlying the P-well; depositing a nitride layer overlying the tunnel oxide layer; and depositing a blocking oxide layer overlying the nitride layer.

An additional embodiment of an integrated circuit (IC) comprises: logic components having gates; non-volatile memory cells coupled to the logic components, wherein the non-volatile memory cells have gates; and wherein the gates of the logic components and the gates of the non-volatile memory cells each have a common single-poly or metal gate structure that is created, in one embodiment, using a same logic process. The non-volatile memory cells are disposed in a P-well that is in turn disposed on an n-doped layer of silicon, wherein the non-volatile memory cells have an Oxide-Nitride-Oxide (ONO) gate dielectric disposed on the P-well, and wherein the memory cell has a drain and a source coupled by a channel region. Optionally, the IC includes access transistors coupled to the non-volatile memory cells in a one-to-one ratio to reduce any disturbance from an erase or a read operation on a given non-volatile memory cell; and wherein a drain of a non-volatile memory cell is coupled to a source of a mated access transistor. The IC can utilize an access transistor for each of the NVM cells or just a portion of them. The NVM cells can be arranged in rows and columns to form a memory array with a bit line coupled to a drain of each non-volatile memory cell located in a given column; a common line coupled to a source of each non-volatile memory cell in the given column; and a word line coupled to a gate of each access transistor of non-volatile memory cells in a given row. The non-volatile memory cells can be located in a common deep P-well, and/or a common n-doped layer.

Another embodiment is a method of fabricating an integrated circuit having common logic and non-volatile memory (NVM), wherein the method comprises: creating an n-doped layer in a silicon substrate; creating a p-well in the n-doped layer; creating a source and a drain region for transistors in both the common logic and the non-volatile memory using a common logic process; and creating an Oxide-Nitride-Oxide (ONO) gate dielectric for non-volatile memory using a single additional gate-dielectric mask; depositing concurrently a single-layer of poly-silicon or metal as a gate for both common logic and non-volatile memory using the common logic process; Other features will be apparent from the accompanying drawings and from the detailed description that follows.

BRIEF DESCRIPTION OF THE DRAWINGS

Example embodiments are illustrated by way of example and not limitation in the figures of the accompanying drawings, in which like references indicate similar elements and in which:

FIG. 3 is a table of the biasing voltages of the signals connecting to the memory array of non-volatile memory cells during different operations, according to one or more embodiments.

FIG. 7 is a table of the biasing voltages of the signals connecting to the memory array during different operations, according to one or more embodiments.

Other features of the present embodiments will be apparent from the accompanying drawings and from the detailed description that follows.

DETAILED DESCRIPTION

A system and method of an electrically programmable and erasable non-volatile memory cell using SONOS transistors fabricated using a single-poly process modified from a logic process. Although the present embodiments have been described with reference to specific example embodiments, it will be evident that various modifications and changes may be made to these embodiments without departing from the broader spirit and scope of the various embodiments. Furthermore, although specific voltages are provided in example embodiments and figures, it is understood that the numbers need not be exact and are used to convey the general concept of the biasing schemes. In the following although embodiments of the memory fabricated using P-substrate with deep N-well for isolation are described, it is also understood that the embodiments can also be fabricated using N-substrate for isolation.

Figure 1:
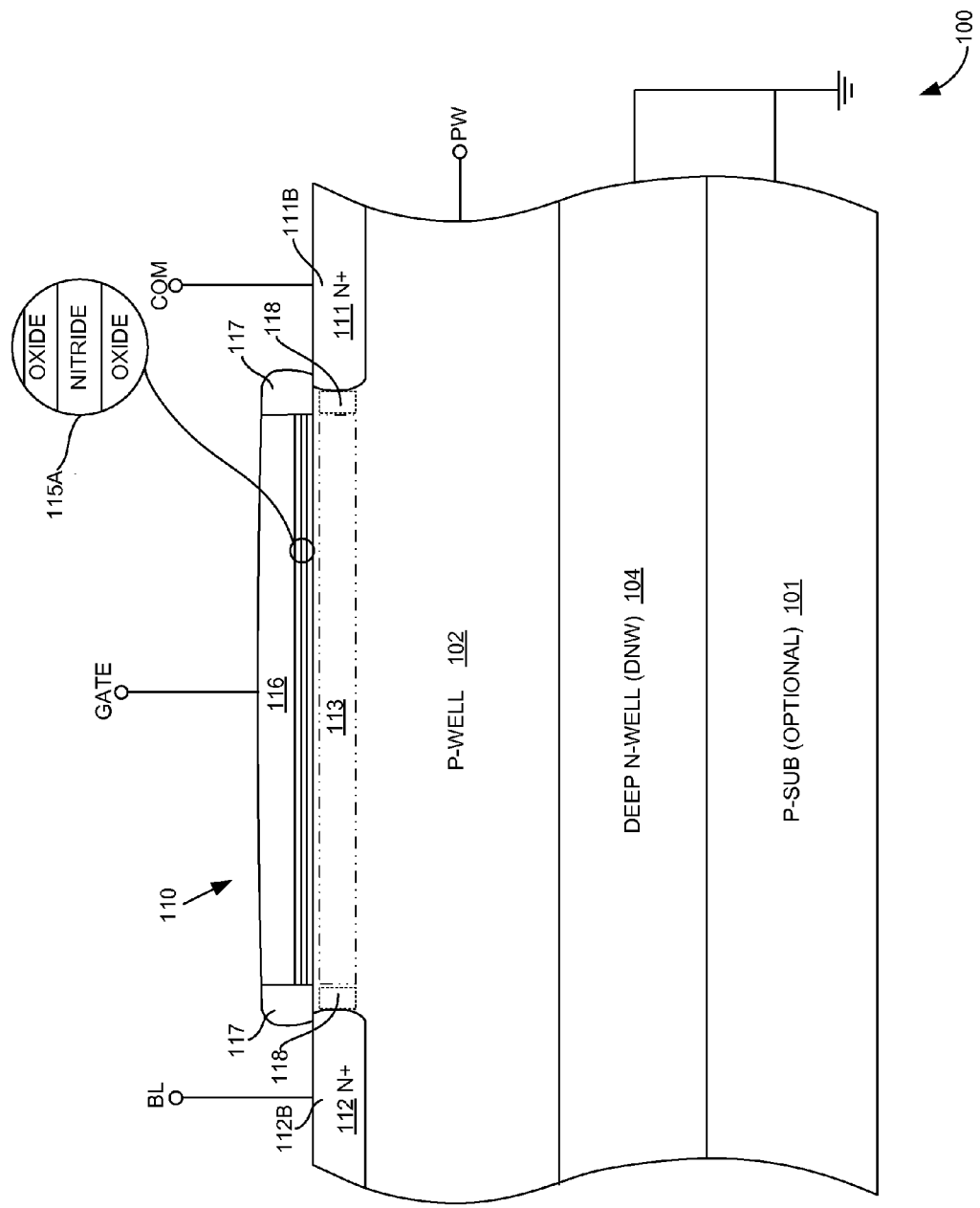
FIG. 1 is a cross section view of the non-volatile memory cell along the channel, according to one or more embodiments.

According to one embodiment of the present invention, a one-transistor memory cell with an oxide-nitride-oxide (ONO) gate-dielectric structure capable of adding, removing, and storing charge in the traps of the ONO layers is provided. FIG. 1 shows the cross section view of the cell along the transistor channel.

In the present embodiment, the cell is fabricated using a 110 nm logic process. The process may provide transistors with two gate-oxide thicknesses of 2.2 nm and 7 nm. The thin-gate transistors are used primarily for logic circuits which have a supply voltage of approximately 1.2 v. The thick-gate transistors are used for circuits with a nominal supply voltage of 3.3 v and a maximum voltage tolerance of 6 v. However, the present invention is applicable to a wide range of logic fabrication processes with different gate thicknesses and different operating voltages.

In the present embodiment, a non-volatile memory cell 100 is fabricated in a P-type silicon substrate 101. A deep N-well 104 is disposed in P substrate 101. A P-well 102 is then disposed in deep N-well 104. A NMOS memory cell 110 is disposed in P-well 102. NMOS transistor 110 includes n-type drain region 112 and source region 111. Source region 112 includes a highly doped, or N+, contact region 112B. Drain region 111 also includes a highly doped, or N+, contact region 111B. Source 111 is connected to a common (COM) line and drain 112 is connected to a bit line (BL). Transistor 110 is surrounded by a shallow trench isolation. Between source 111 and drain 112 is the channel region 113. A gate-dielectric structure 115 overlying P-well 102 consists of a tunnel oxide layer overlying substantial part of the channel between the source and drain, a nitride layer disposed on toped of the tunnel oxide, and a blocking oxide layer overlying the nitride layer. The ONO structure creates traps in the nitride layer and oxide nitride interface. During program or erase operation, hot carriers tunneling from the channel or source or drain area through the tunneling oxide layer are captured by the traps. The bottom or tunnel oxide has a thickness of approximately 2 nm, the nitride layer thickness of approximately 50 A and the blocking oxide has a thickness of approximately 40 A. A conductively doped poly-silicon gate is disposed on top of ONO gate-dielectric structure 115 forming the gate 116 of the NMOS transistor. To comply with the fabrication of a typical logic process, during the formation of the N+ or P+ regions in the source or drain of a transistor, spacer 117 stops the P+ or N+ implant from getting into the lightly doped P or N regions. The structure of a spacer and the method of creating under-lapped source and drain regions are described in "A Novel CMOS Compatible Embedded Nonvolatile Memory with Zero Process Adder" by M. J. Breitwisch, Proceedings of the 2005 IEEE International Workshop on Memory Technology, Design, and Testing, which is incorporated by reference herein in its entirety.

However, the lightly doped source and drain region between the channel 113 and the N+ regions 111B and 112B is masked off during the implantation process when the lightly-doped region is formed. The absence of the light-doped region causes the formation of under-lapped source and drain region in the memory transistor, e.g., N-well dopant regions 118. The under-lapped source and drain does not have significant effect on the electrical characteristics of the transistor during read operation. However, in the absence of the lightly-doped region, the abrupt source and drain junction lowers the reversed junction bias voltage during the erase operation when band-to-band tunneling is induced.

The memory cell is programmed using Fowler-Nordheim (F-N) tunneling during which electrons tunnel from the channel 113 of the transistor 110 to the ONO structure and trapped inside the ONO layers. The memory cell is erased using Band-to-Band hot-hole Injection (BBHHI), i.e. as assisted by Gate-Induced-drain-Lowering Band-to-band (GIDLBB) tunneling, during which holes tunnel from the source or drain area to the ONO layers. Both F-N tunneling and GIDLBB tunneling are physical mechanisms commonly known by those skilled in the art of semi-conductor device physics.

Figure 2:
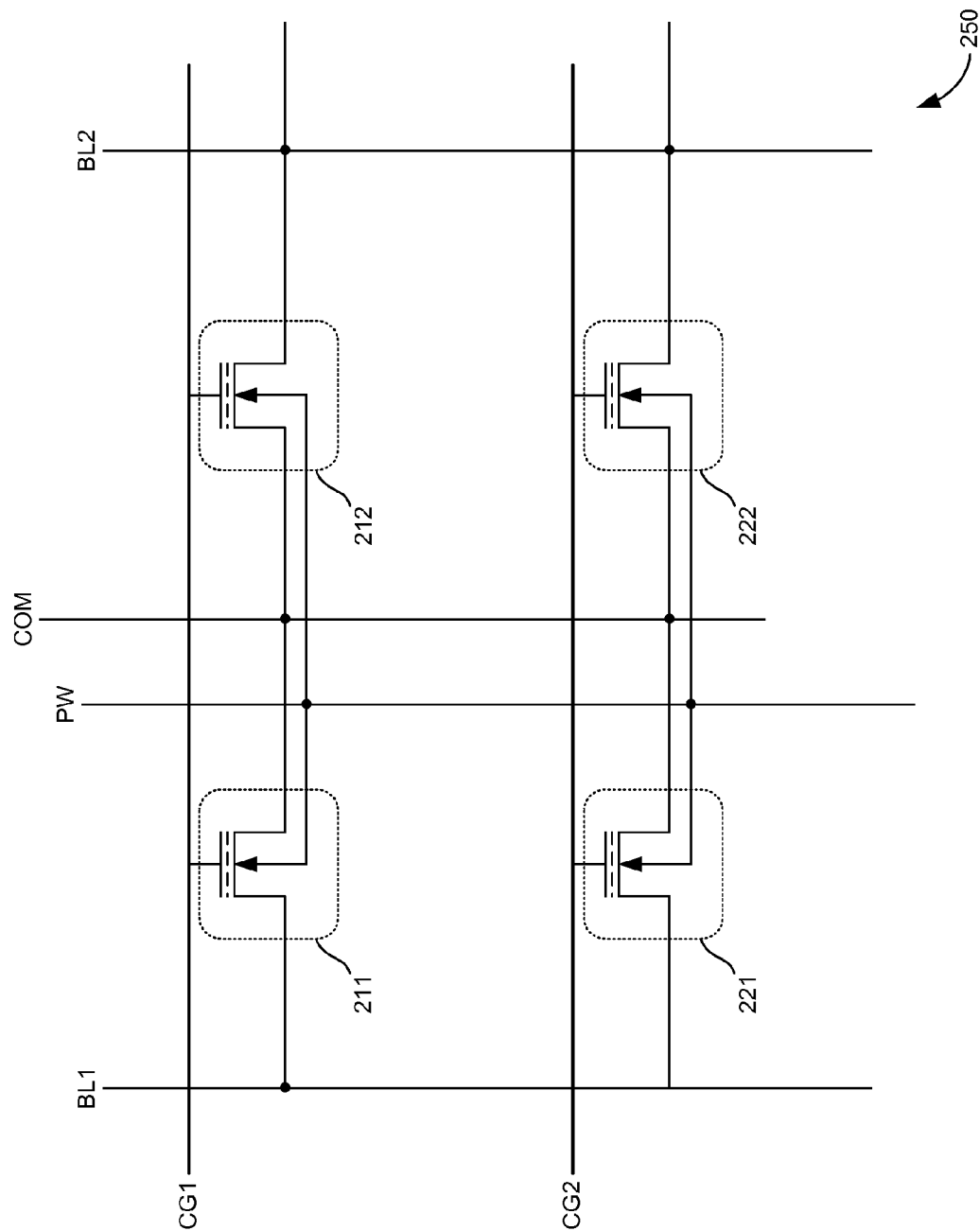
FIG. 2 is a circuit schematic of non-volatile memory cells arranged in a two by two memory array, according to one or more embodiments.

In most applications, multiple non-volatile cells 100 may be coupled together to form a memory array. For illustration purposes, the operation of a two by two memory array 250 is described and illustrated in FIG. 2. The array contains four memory cells arranged into two rows and two columns. By increasing and/or decreasing the number of rows and/or columns, arrays of different sizes can be formed. The memory array 250 includes memory cells 211, 212, 221, and 222.

In the embodiment, gates of memory cells 211 and 212 are connected to control-gate signal CG1 to form a row of memory, and gates of memory cells 221 and 222 are connected to CG2 to form another row of memory. The source and drain of cells 211 and 221 are connected to COM and BL1 respectively to form a memory column. Similarly, source and drain of cells 212 and 222 are connected to COM and B12 respectively to form another memory column. Memory array 250 is fabricated in a P-well which is disposed in a deep N-well, which in-turn is disposed in a p-type substrate. In other words, the P-wells and the deep N-wells of the memory cells are merged together to form a single P-well and a single deep N-well (e.g., DNW 254), although separate P-wells and N-wells may be used as well. The memory array is fabricated in the same substrate as other on-chip logic or analog circuits, or both.

During normal operations, the substrate may be connected to ground or 0 v. The deep N-well may be connected to the same voltage potential as the P-type substrate. The P-well of the memory array may be connected to a voltage potential equal to or lower than the potential of the COM signal which is coupled to a voltage equal to or below ground during memory operations. Therefore the bulk or P-well of the cell transistors is electrically isolated from the P-substrate by the deep N-well.

FIG. 3 is a table of the biasing voltages of the signals connecting to the memory array during different operations, according to one embodiment. Each of memory cells in array 250 may be independently erased but all the cells in a row are programmed together. Consequently, memory array 250 can be used to form a large FLASH memory.

A row of memory cells may be designated for programming, according to one embodiment. During programming, electrons are added to the traps of the ONO structure of the transistors in the selected row, causing the threshold voltage of the transistors to increase, making it more difficult to turn on, and causing the readout current to decrease during read operations. For example, memory cells 221 and 222 in row 2 may be selected for program with CG2 coupled to 5V; BL1, BL2 and COM coupled to −5 v. The cells 221 and 222 in row 2 have a potential of 10 v between their gate and channels causing electrons to tunnel from the channel to the gate and trapped in the ONO layers. The trapped electrons increase the threshold voltage of the NMOS transistors 221 and 222. In the unselected row, with CG1 coupled to 0 v, cells 211 and 212 have a potential of 5 v between their gate and channels. The voltage potential is not sufficient to induce significant electron-tunneling and threshold voltage of NMOS transistors 211 and 222 is not significantly modified.

In another operation, a memory cell may be designated for erase. During the erase operation, holes are injected to the traps in the ONO layers of the selected cell, causing the threshold voltage of the NMOS transistor to decrease, making it easier to turn on, and causing the cell current to increase during read operations.

For example, memory cell 222 is selected for erase with CG2 coupled to −3 v; BL2 coupled to 5 v, and COM coupled to −1 v. Under this bias condition, the drain junction of transistor 222 connecting to BL2 has large reverse bias of 6 v and under the influence of high negative gate bias −3 v. Consequently Gate-induced-drain-lowering (GIDL) band-to-band hot hole injection tunneling occurs causing hot holes to inject into the traps in the ONO structure and lowering the threshold voltage of NMOS 222. The unselected cells 211 and 221 in column 1 are not affected by the erase operation. With BL1, COM and P-well all coupled to −1 v, the junctions of transistors 211 and 221 are not reversed biased. Therefore band-to-band tunneling cannot take place. Unselected cell 212 with its drain connecting BL2, the drain is reversely biased at 6 v. However, with the gate coupled to a potential of 0 v through CG1, the gate potential is not sufficient to induce significant Band-to-band tunneling. Also holes tunneled across the drain junction to the channel area are absorbed by the P-well instead of ONO traps because the P-well is coupled to a lower voltage potential than that coupled to the gate. Therefore, the threshold voltage of the unselected cell transistors 211, 221, and 212 is not affected by the erase operation.

In a read operation, the data in a row of memory cells can be read simultaneously. The NMOS transistors in a programmed and erased cell have a threshold voltage of approximately 2.5 v and 1 v, respectively. In one embodiment, memory cells in row 2 are selected for the read operation. Assuming cell 221 is in the programmed state, but cell 222 is in an erased state. Accordingly, the common line (COM) and P-well are coupled to 0 v, all the bit lines (BL) are pre-charged to 1.5 v, the unselected word line CG1 is coupled to 0 v but the selected word line, CG2, is coupled to 1.5 v. As a result, transistor 222 is turned on, pulling BL2 to 0 v, but transistor 221 stays off, leaving BL1 at 1.5 v. This is because, in the program state, the threshold voltage of transistor 222 is higher than the 1.5 v gate voltage, but in the erase state the threshold voltage of transistor 221 is lower than the gate voltage. The lower voltage in BL2 is subsequently sensed by a sense amplifier and driven to a data output signal with a state of "0." The high voltage in BL1 is sensed by another amplifier and driven to another output signal with a state of "1." Note that transistors in cells, with unselected rows with their gates coupled to 0 v, are turned off regardless of their program or erase. Consequently, they have little effect on the bit line voltages.

Figure 4:
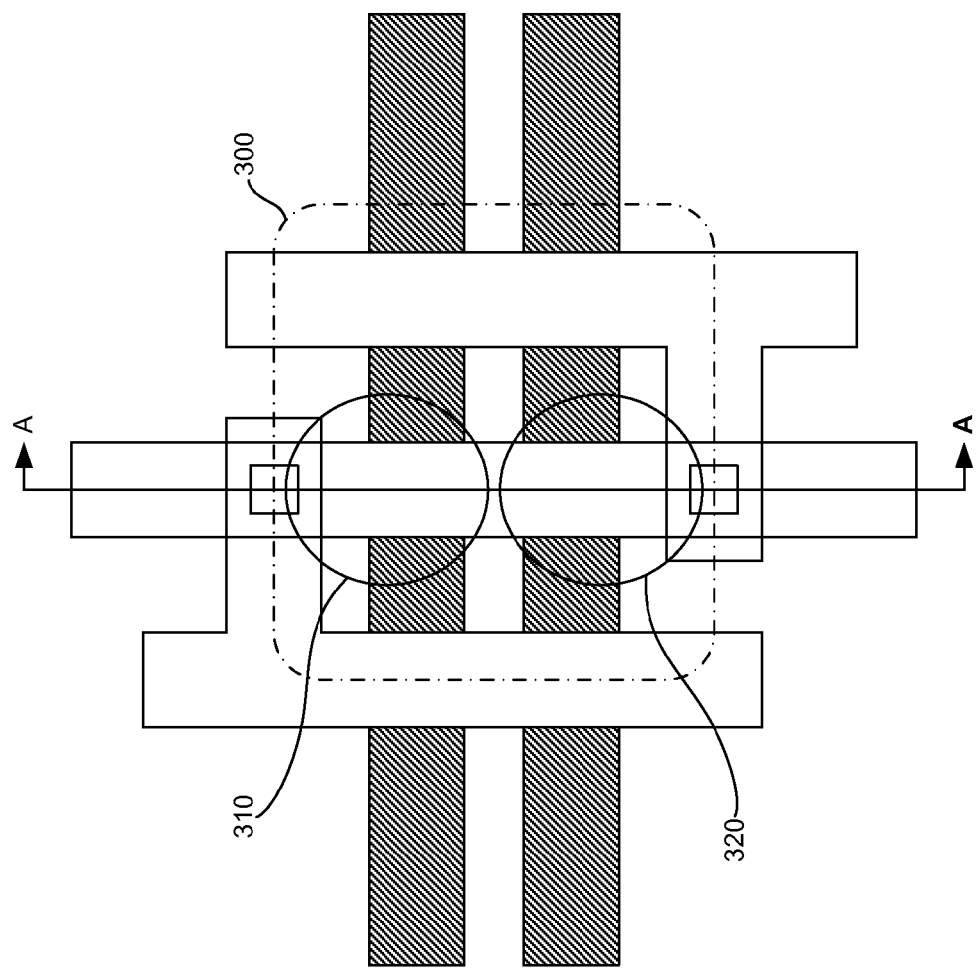
FIG. 4 shows the top layout view of the non-volatile memory cell having an access transistor, according to one or more embodiments.
Figure 5:
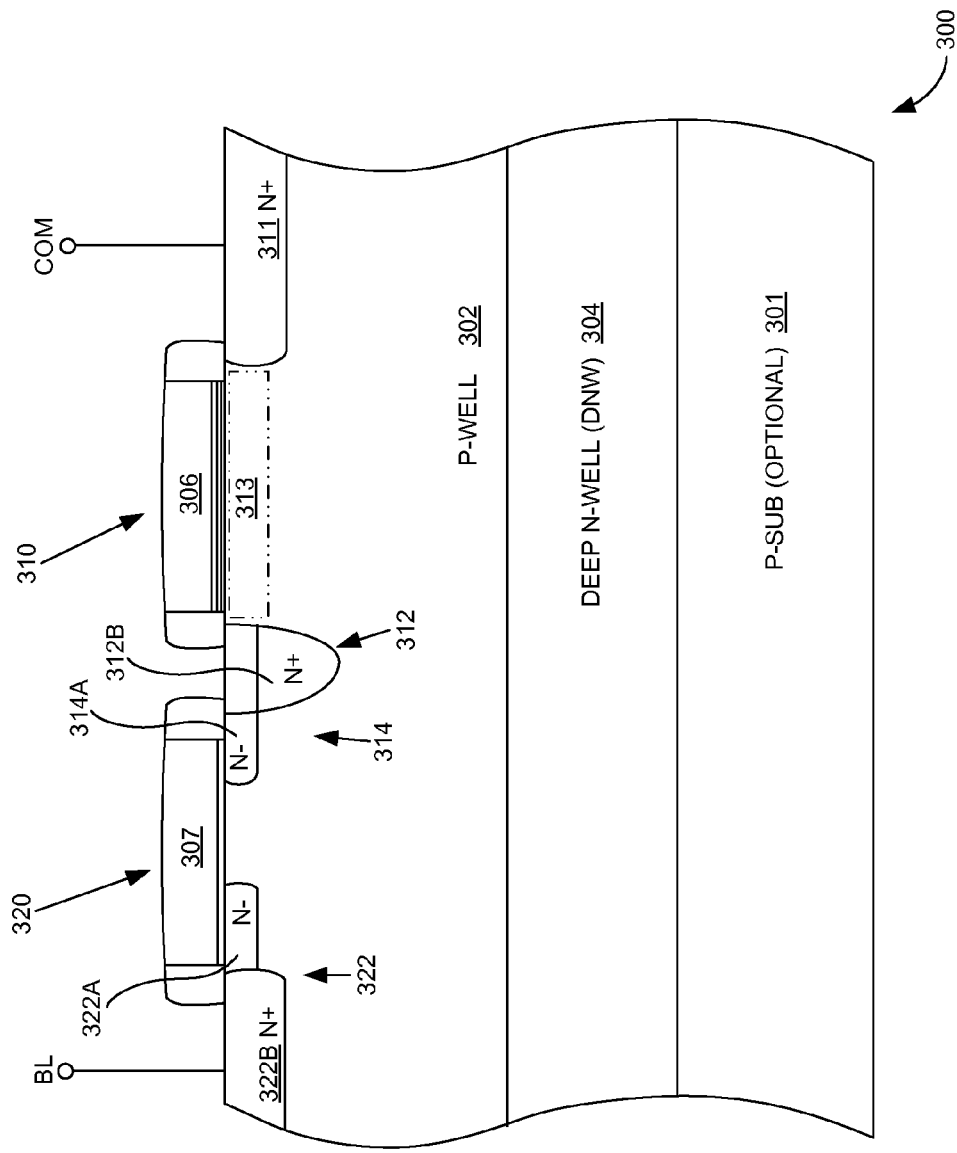
FIG. 5 illustrates the cross section of the memory cell of FIG. 4 along section line A-A.

FIG. 4 shows the top layout view of the non-volatile cell 300 with an access NMOS transistor 320 added in series with the tunneling transistor 310 to the non-volatile memory cell 300. The cross sections along section lines A-A, is shown in FIG. 5. Referring now to FIG. 5, the non-volatile cell 300 consists of tunneling n-channel SONOS transistor 310 and access NMOS transistor 320. Tunneling SONOS transistor 310, which is an NMOS transistor, includes n-type drain region 312, which includes N+ contact region 312B. The N+ region 312B of the drain of tunneling transistor 310 is shared with the N+ region of the source of access transistor 320. The two NMOS transistors are thus connected in series. Transistor 310 includes N+ source 311 and includes a channel region 313 located between the source 311 and drain 312 of transistor 310. Transistor 320 includes lightly-doped N regions 314A and 322A respectively in its source 314 and drain 322 region.

The bit line (BL) is connected to the drain 322 of access transistor 320. Gate 306 of transistor 310 is coupled to a control-gate signal CG which is used to control the voltage of the floating gate during memory operations. In the present embodiment, the gate conductor of transistor 310 and 320 are composed of the same material used for the gates of the logic transistors, for example poly-silicon for SONOS technology or metal for MONOS technology. Underlying the gate 306 of transistor 310 is an ONO dielectric structure composed of a layer of tunneling silicon oxide overlying the channel 313, a silicon nitride layer overlying the tunneling oxide layer, and a blocking silicon oxide layer overlying the nitride layer and underlying the gate. The thicknesses of the ONO layers can be the same as those in NMOS transistor 100 in the embodiment described above. Transistor 320 is fabricated similarly to the IO transistors. The gate of the access transistor 320 is connected to the word line (WL). By controlling the access gate voltage through WL, the access transistor 320 can be turned on or off, thereby coupling or decoupling the tunneling SONOS, or readout transistor, to/from bit line BL. By using access transistor 320 to decouple the memory cell from the bit line (BL) during erase and read operation when the cell is not selected, the disturbance on the tunneling transistor 310 is minimized. The decoupling of the tunneling transistor from the bit line also allows the tunneling transistor to operate in the deep erase region where transistor 310 threshold voltage is negative. Thus tunneling transistor in deep erase region is conductive even under zero gate bias. With the access transistor turned off when the cell is not selected for read, the conductive tunneling transistor has no effect on the bit line. A deep erase cell with negative threshold voltage generates more readout current for the same bias voltages when selected for read than that of an erase cell with positive threshold voltage.

The source of the transistor 310, as in memory cell 100, is connected to the common signal (COM). The NMOS transistors 310 and 320 are disposed in P-well 302 which is disposed in a deep N-well (DNW) 304 which, in turn, is disposed in a P-substrate 301.

Figure 6:
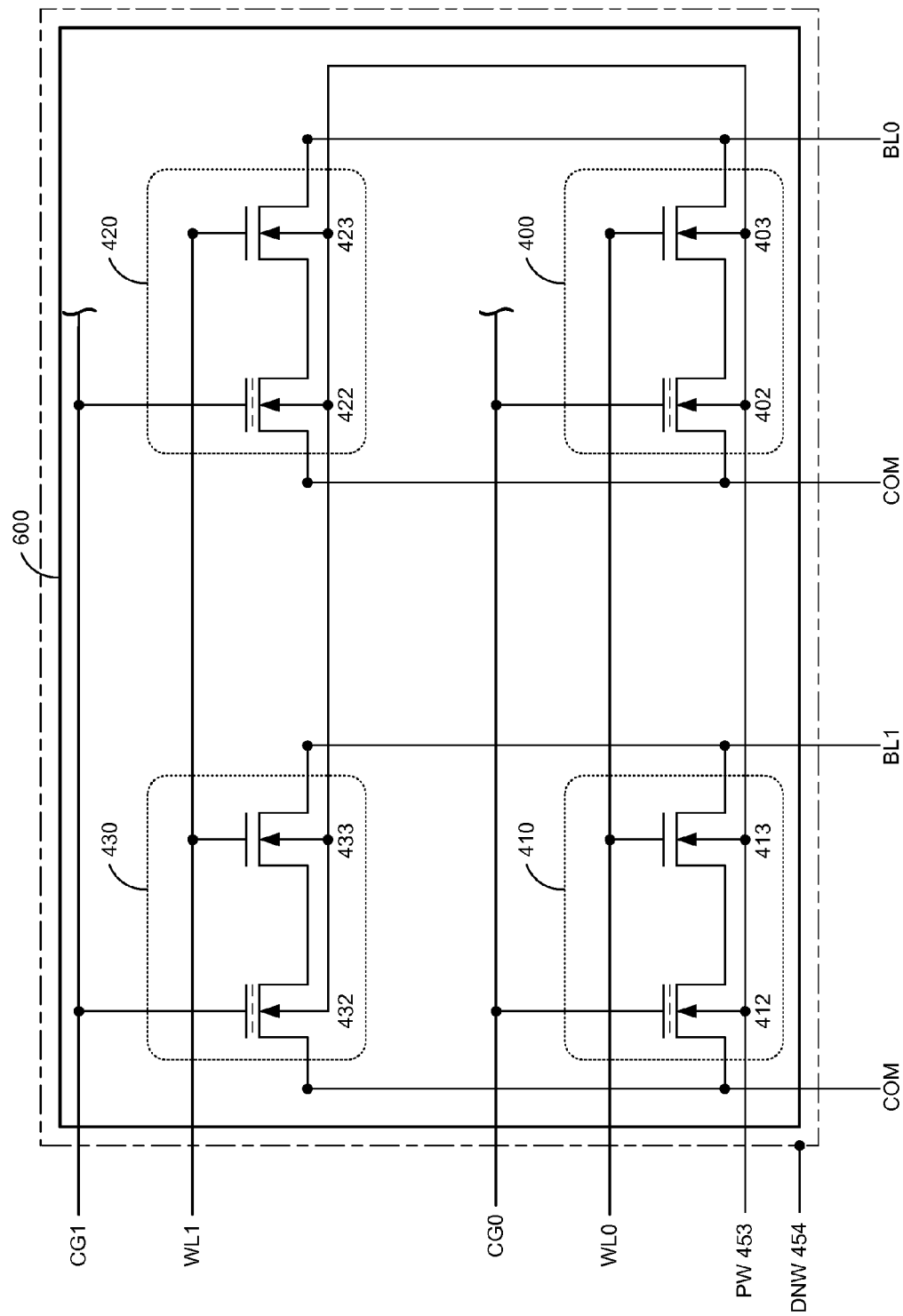
FIG. 6 shows a memory array that includes four of the memory cells of FIG. 4 arranged in two rows and two columns, according to one or more embodiments

FIG. 6 shows a memory array 600 that includes four memory cells that are similar to memory cell 500 of FIG. 5 arranged in two rows and two columns, according to one embodiment. Accordingly, cell 420 and 430 form one row of memory and have their WL and CG lines connected to WL1 and CG1 respectively. Likewise, cell 400 and 410 form another row of memory and have their WL and CG line connected to WL0 and CG0 respectively. Cell 400 and 420 form a column with their common and bit line connected to COM and BL0 respectively. Likewise, cell 410 and 430 form another column with their common and bit line connected to COM and BL1 respectively. The tunneling transistors of cell 430, 420, 410 and 400 are 432, 422, 412, and 402 respectively. The access transistors of cell 430, 420, 410 and 400 are 433, 423, 413 and 403 respectively. The COM line is common to all the cells in the array in the present embodiment.

The memory array 600 is fabricated in a P-type substrate. The deep N-well of the memory cells are merged together to form one single deep N-well that is coupled to signal deep N-well (DNW) 454 which has a ground potential during normal operations. Likewise, the P-wells of the memory cells are merged together to form one single P-well that is coupled to signal P-well (PW) 453. The memory array is fabricated in the same substrate as other on-chip logic circuits that may require the substrate to be connected to ground or 0 v.

FIG. 7 is a table of the biasing voltages of the signals connecting to the memory array during different operations, according to one embodiment. Each of the memory cells in array 600 can be independently erased but cells in a row are programmed together. Consequently memory array 600 can be used to form a large Flash memory.

In one embodiment, a memory row of array 600 may be designated to be programmed. During programming, electrons are added to the traps in the ONO layers of the selected cells, causing the threshold voltage of the tunneling transistors to increase, making it harder to turn on, and causing the readout current to decrease during read operations.

Assuming row 0 of array 600 is selected for programming with CG0 coupled to 5 v, with WL0 coupled to 0 v, and with COM, PW, BL0 and BL1 coupled to −5 v. Tunneling transistors 402 and 412 of memory cells 400 and 410 respectively have 10 v coupled between their gate and channel region. The large gate to channel bias induces F-N tunneling to occur in these transistors causing electrons to tunnel from the channel area to the gate and captured by the traps in the ONO gate dielectric of transistors 402 and 412. Thereby the threshold voltage of transistors 402 and 412 is increased.

For the memory cells in the unselected row 420 and 430, with CG1 coupled to 0 v, the tunneling transistors 422 and 432 receive only 5 v bias across their gate and channel. The relative small bias is not sufficient to induce significant F-N tunneling and consequently the threshold voltage of transistors 422 and 432 is not affected by the program operation.

A memory cell of array 600 may be selected for erase. Assuming cell 400 is selected for erase with CG0 coupled to −4 v, with COM and PW coupled to −2 v, with BL0 coupled to 4 v, and with WL0 coupled to 5 v. Access transistor 403 is turned on by coupling the 4 v supply through BL1 to the drain of tunneling transistor 402 and inducing band-to-band tunneling to occur. Under the influence of the negative gate bias, hot holes are thus generated in the drain of transistor 402 and tunnel towards the gate but are captured by the traps in the ONO layers. Thereby lowering the threshold voltage of tunneling transistor 402.

During the erase operation, BL1 is coupled to 0 v. In the unselected cell 410, with WL0 coupled to 5 v, access transistor 413 is turned on thereby coupling the 0 v on BL1 to the drain of tunneling transistor 412. With P-well coupled to −2 v, the drain of transistor is thus under reverse bias of −2 v which is not sufficient to induce significant band-to-band tunneling to affect the threshold voltage of tunneling transistor 412. Thus erase disturbance in unselected cell 410 is insignificant. With CG0 coupled to −4 v, tunneling transistor 412 is turned off, decoupling BL1 from COM.

With WL1 and CG1 coupled to −2 v, cells 420 and 430 in the unselected row have their access transistors 423 and 433 turned off. Drain-to-substrate junctions of tunneling transistors 422 and 432 have 0 voltage bias. Band-to-band tunneling is not induced and the threshold voltage of tunneling transistors 422 and 432 is not affected. Thus cells in the unselected row are not affected by the erase operation.

In a read operation of array 600, the data in a row of memory cells can be read simultaneously. The tunneling transistor in a programmed and erased cell has a threshold voltage of approximately 2 v and −1 v, respectively. In one embodiment, a read operation may be performed when cell 400 is in the programmed state, cell 410 is in the erased state, and row 0 is selected for the read operation. Accordingly, the common line (COM) is coupled to 0 v, all the bit lines (BL) are precharged to 1.5 v, the coupling-gate and word line of the selected row CG0 and WL0 are coupled to 1.5 v, and P-well is coupled to 0 v. As a result, both the access transistors 403 and 413 of the selected row are turned on coupling the tunneling transistors to the bit lines. With CG0 coupled to 1.5 v and with a threshold voltage of about −1 v, tunneling transistor 412 is turned on, conducting current between BL1 and COM pulling BL1 voltage to ground. However, in the program state with a threshold voltage about 2 v, tunnel transistor 402 of cell 400 remains off and the voltage at BL1 remains at about 1.5 v. In the unselected row, with WL1 coupled to 0 v, the access transistors of cells 420 and 430 are turned off decoupling the cells from the bit lines. The low voltage in BL1 and high voltage in BL0 is sensed by sense amplifiers coupled to the bit lines and subsequently driven to a data output signals with a state of "0" and "1" respectively.

Figure 8A:
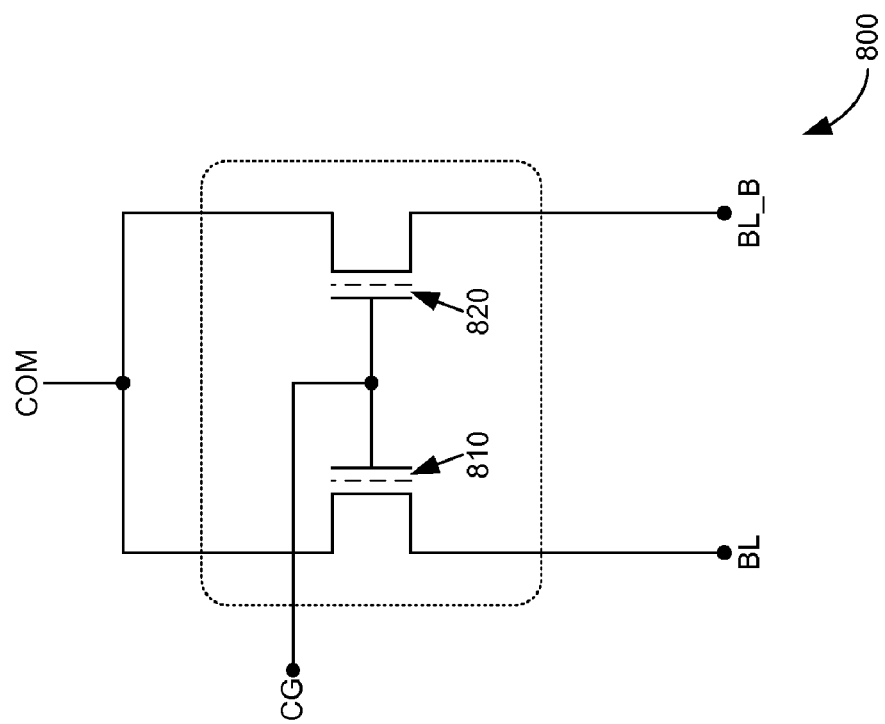
FIGS. 8A and 8B illustrate (a) two memory cells combined to form a differential cell; and (b) a schematic of a differential sense-amplifier for use in memories with the differential cell, according to one or more embodiments

Many different variations of the memory cell are possible and will be apparent to one of ordinary skill to the art. For example, two of the memory cells (e.g., the memory cell 100 of FIG. 1) can be combined as shown in FIG. 8A to form a differential cell 800 to increase the operational margin of the cell.

Accordingly, differential cell 800 includes NMOS transistors 810 and 820 with ONO gate-dielectric structure similar to transistor 100 in FIG. 1. Transistor 810 and 820 are fabricated in a P-well which is disposed in a deep N-well. The deep N-well is disposed in a P-substrate. The deep N-well isolates the cell electrically from the P-substrate. Alternatively, the P-well is disposed in an N-substrate.

The two halves of the cell 800 share one COM signal and one control gate (CG) signal, but the two tunneling transistors 810 and 820 are connected to complementary bit line signals BL and BL_B. When storing data (e.g., "1") in the cell, one readout transistor (e.g., readout transistor 810) can be put in the program state, and the other readout transistor (e.g., readout transistor 820), can be put in the erase state. When storing the opposite data (e.g., "0"), read out transistor 810 can be put in the erased state and read out transistor 820 can be put in the programmed state.

Figure 8B:
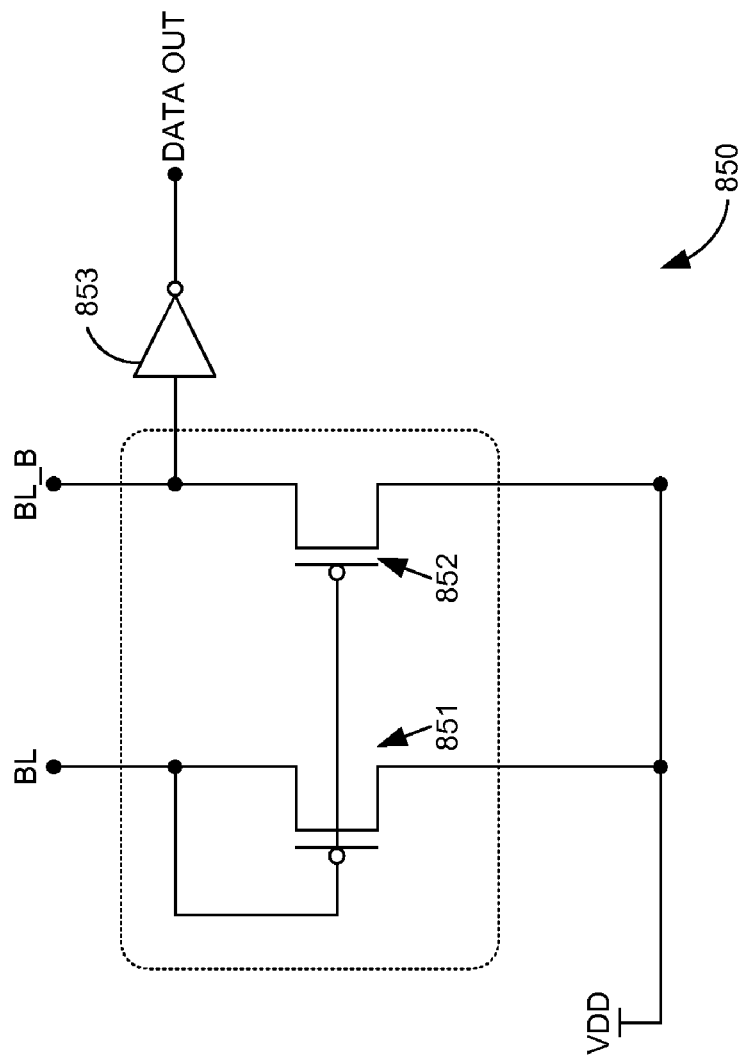

During a read operation, COM may be coupled to 0 v, and CG may be coupled to 1.5 v. A differential sense amplifier 850 such as the one shown in FIG. 8B when coupled to the complementary bit lines can be used to sense the voltage differential on the differential bit-line pair. Differential amplifier includes 2 p-channel transistors 851 and 852 with their source coupled to supply Vdd which has a voltage of about 1.2 v. Transistor 851 and 852 with matched channel width and channel length forms a current comparator comparing the current flowing from their drains into the selected memory cell. If cell transistor 810 conducts more current than transistor 820, then p-channel transistor 852 pulls BL_B to a potential close to Vdd. If cell transistor 810 conducts less current than transistor 820, then cell transistor 820 pulls BL_B to 0 v. The logic state in BL-B is inverted by inverter 853 and driven on the Data Out signal. Differential sense amplifier 850 is commonly known by those with ordinary skilled in the art of non-volatile memory design.

In applications, the transistor in the program state can be in weak program such that the threshold voltage of the transistor is 1.3 v instead of 2 v or above. During read operation, CG is coupled to 1.5 v so that both the erase transistor and the weak-program transistor are turned on. In a single transistor memory cell, the current conduction of a weak-program transistor may result in read data of wrong polarity. However, in the case of differential memory cell, even the program transistor is in weak-program, the other transistor in erase state with a threshold voltage of about 1 v conducts higher current than the transistor in weak-program state. The current difference in the cell transistors can still be sense correctly by sense amplifier 900. Therefore, the differential cell is more fault tolerant than the single transistor memory cell.

Figure 9A:
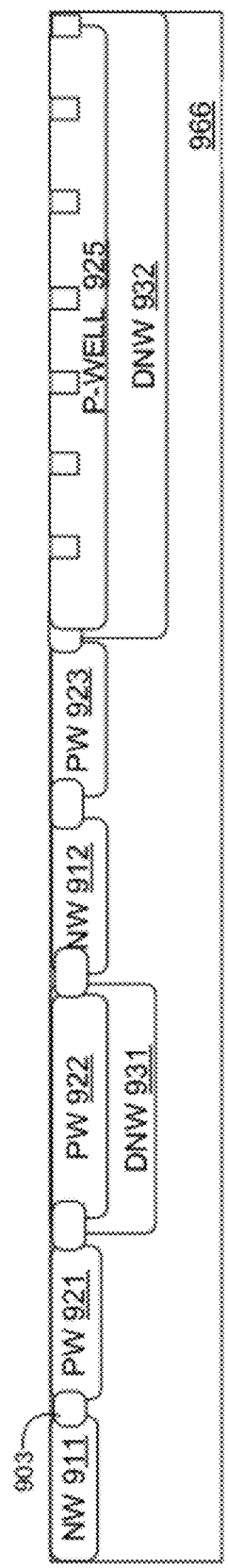
FIGS. 9A-9F illustrate the additional processing steps, the steps before and the steps after the additional steps in a logic process for the fabrication of the embedded non-volatile memory along with other CMOS devices in the logic process, according to one or more embodiments
Figure 9B:
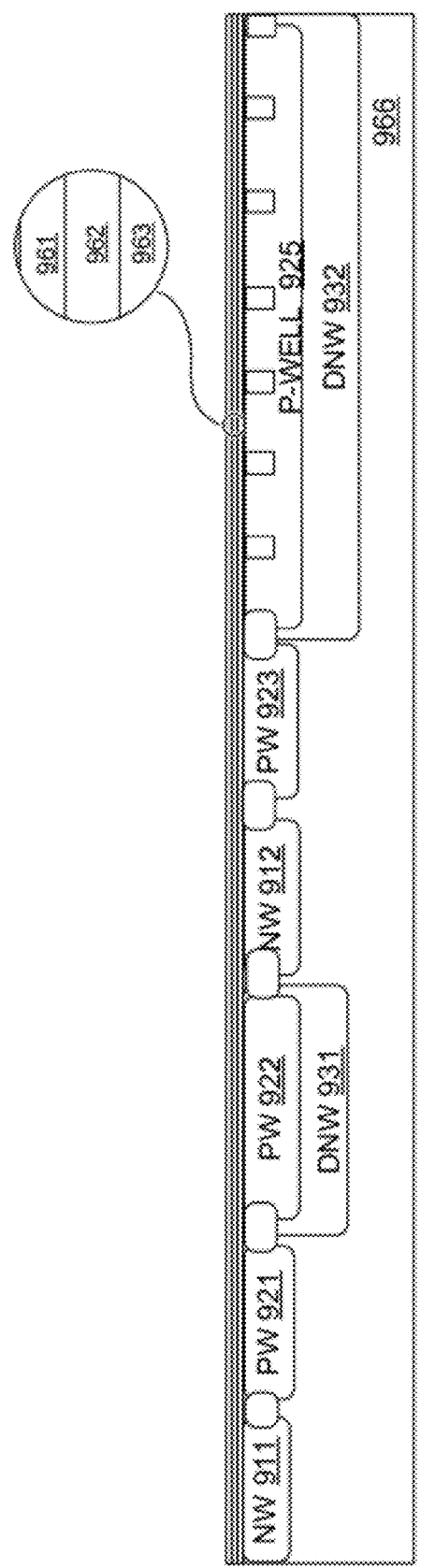
Figure 9C:
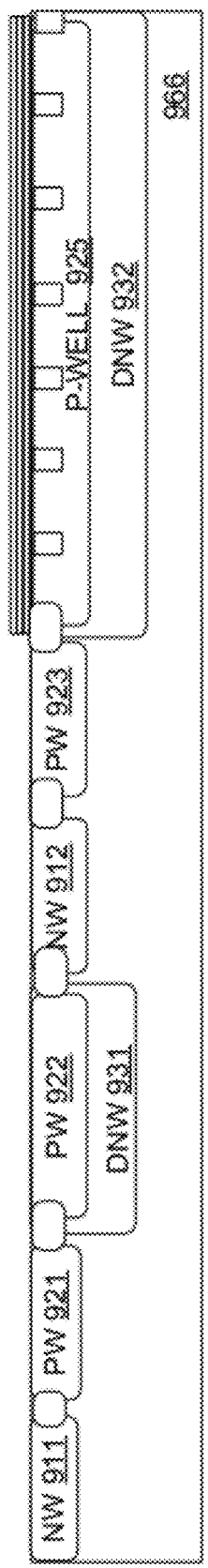

The different embodiments of non-volatile memory in the present invention described above can be fabricated along with other devices in a logic process by adding one masking step to the logic process. The physical characteristics of devices including CMOS transistors, diodes, and parasitic bi-polar transistors in the logic process is preserved and not affected by the additional processing steps. FIGS. 9A-9C illustrates the additional processing steps for the fabrication of the embedded non-volatile memory. To make the illustration easier to understand, the processing steps before and after the added steps are also shown.

Accordingly, FIG. 9A shows the cross section of an area of a semi-conductor system under fabrication. The area includes logic CMOS transistors, IO CMOS transistors, n-channel transistor in deep N-well, as-well-as multiple non-volatile memory cells of the present invention. Respectively, logic PMOS transistor is disposed in N-well (NW) 911, logic NMOS transistor is disposed in P-well (PW) 921, isolated NMOS transistor is disposed in P-well 922, TO PMOS transistor is disposed in N-well 912, IO NMOS transistor is disposed in P-well 923, and the n-channel SONOS memory cells are disposed in P-well 925. P-well 922 and 925 are disposed in deep N-well 931 and 932 respectively. The semi-conductor system is built in a P-type silicon substrate 966.

Figure 9D:
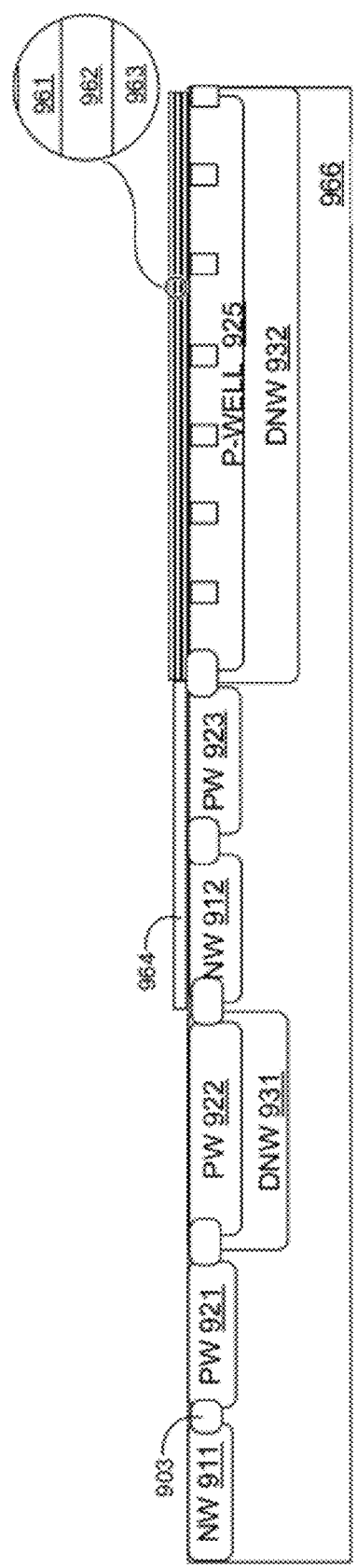
Figure 9E:
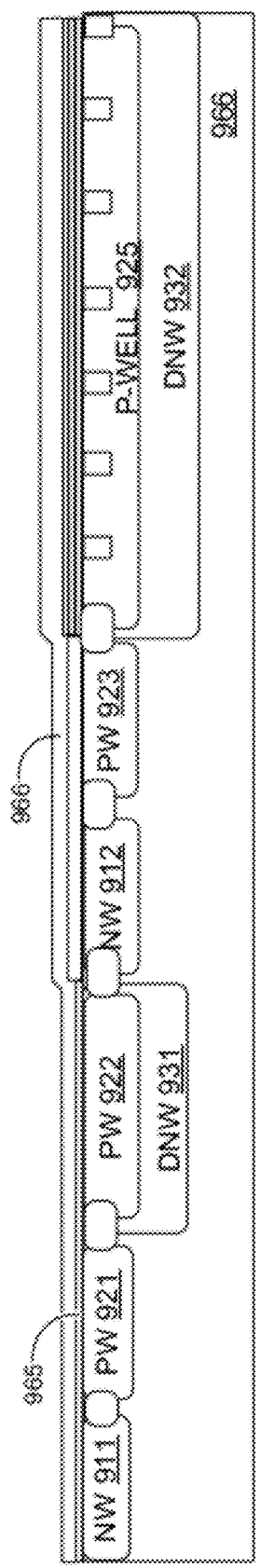
Figure 9F:
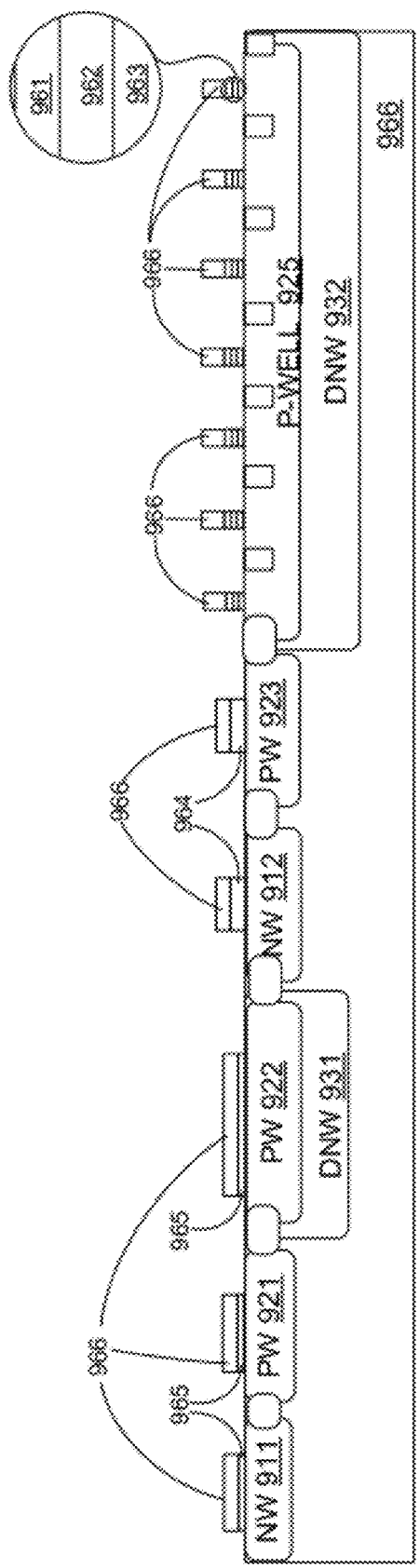

FIG. 9A shows the cross section of the chip after the formation of the wells and the shallow trench isolations, e.g., trench isolation 903 between NW 911 and PW 921. FIGS. 9B and 9C show the additional process steps required to form the embedded non-volatile SONSO transistors. FIG. 9B shows the result of the deposition of oxide layer 961, nitride layer 962 and oxide layer 963. FIG. 9C shows the result after the etching of the ONO layers using the additional ONO mask. ONO films outside the embedded non-volatile memory area are etched away. FIGS. 9D, 9E, and 9F are part of the original logic process showing the gate formation of all the MOS transistors other than the SONOS transistors. FIG. 9D shows the result after gate-oxide formation for the IO CMOS transistors. FIG. 9E shows the result after the gate-oxide formation for the logic CMOS transistors and the gate-poly-silicon deposition. FIG. 9F shows the result after gate-poly-silicon etch and gate-dielectric etch. The rest of the processing steps for fabricating the chip follow those of common logic process.

Figure 9G:
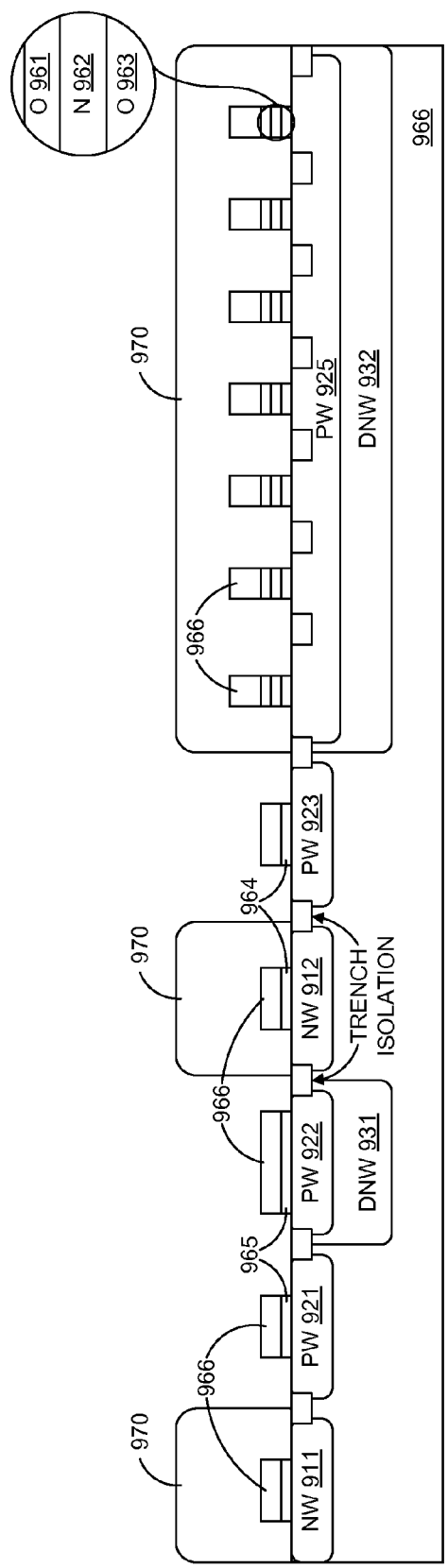
FIGS. 9G-9I illustrate the blocking of the light-doped diffusion implant in the transistor of the memory cells during the formation of the light-doped diffusion source and drain regions in the N-channel MOS transistors.
Figure 9H:
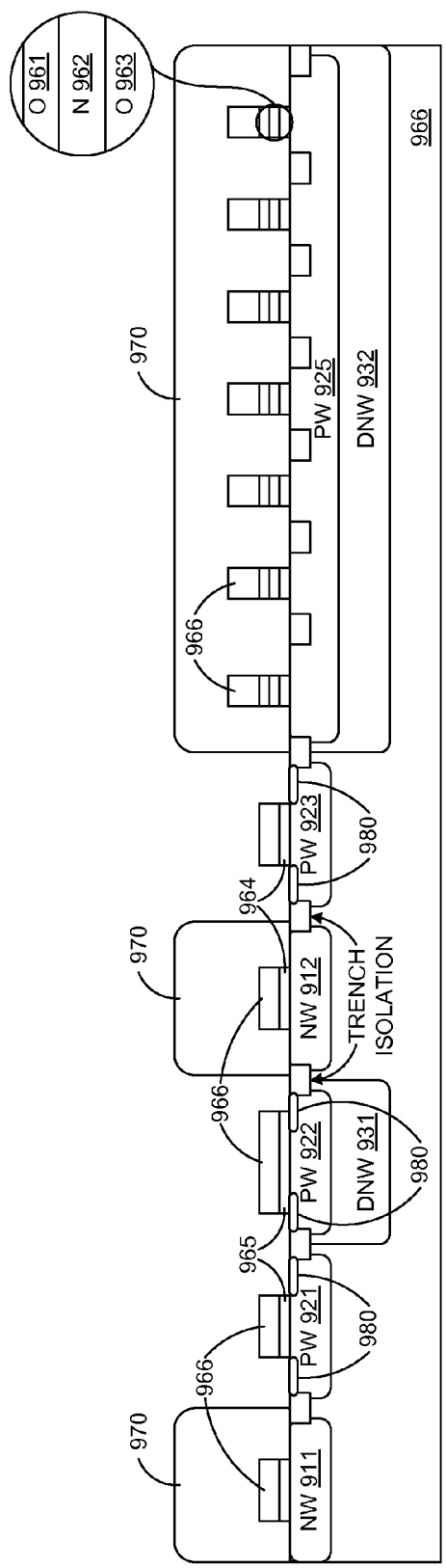
Figure 9I:
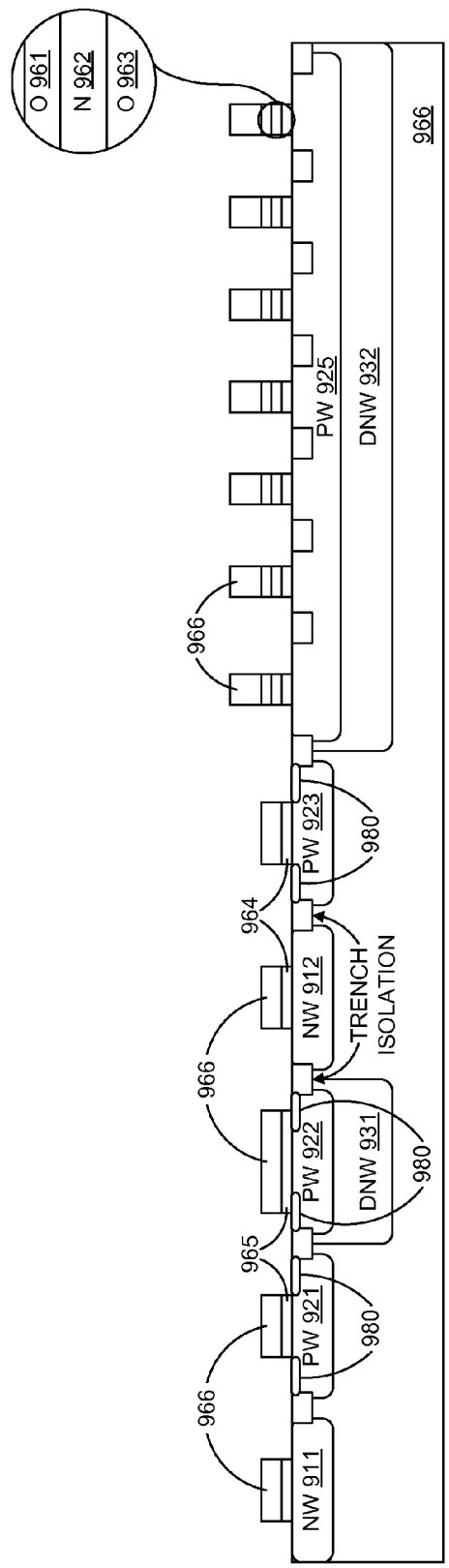

FIG. 9G shows the deposition and etching of photo-resist layer 970 forming the mask of the lightly-doped N implant. FIG. 9H shows the cross section of the chip after receiving the lightly-doped N implant 980. Notice that only the silicon area without any film (resist, poly, oxide) coverage receives the low energy N− implant. Since the N-channel memory transistors are all covered by photo-resist 970, the memory transistors do not receive any of the lightly-doped N implant. FIG. 9I shows the cross section of the chip after the photo-resist 970 is removed. Notice the absence of the light-doped diffusion region in the N-channel transistors of the memory cells. All the N-channel transistors including those in the memory cells will receive the N+ source and drain implant in the later processing steps (not shown). However, the absence of the N-regions in the N-channel transistors of the memory cells causes under-lapped source and drain to form in those transistors. The rest of the processing steps for fabricating the chip follow those of common logic process, and are not shown. The fabrication sequence illustrates the formation of the embedded non-volatile memory of the present invention requires only one additional mask to a common logic process. In addition, the additional processing steps in forming the embedded non-volatile memory occur before source and drain formation and any implant after the well formation, therefore the electrical characteristics of other transistors fabricated in the process are not affected by the additional steps.

It will be appreciated that the various operations, processes, and methods disclosed herein may be embodied in a machine-readable medium and/or a machine accessible medium compatible with a data processing system (e.g., a computer system), and may be performed in any order (e.g., including using means for achieving the various operations). For example, in logic devices which have an N-type substrate, the deep N-well is no longer required; the P-well which contains the embedded non-volatile memory in the present invention can be disposed directly on the N-type substrate. Accordingly, the specification and drawings are to be regarded in an illustrative rather than a restrictive sense.

What is claimed is:

1. A non-volatile memory cell embedded in common logic, the cell comprising:
   an n-doped layer of silicon;
   a P-well disposed on the n-doped layer; and
   an n-channel Metal Oxide Semiconductor (NMOS) transistor with an Oxide-Nitride-Oxide (ONO) gate dielectric disposed in the P-well, the NMOS transistor comprising;
   a source;
   a drain;
   a channel region disposed between the source and the drain; and
   one of a poly-silicon and a metal control gate disposed on the ONO gate dielectric to result in one of a SONOS and a MONOS transistor, respectively, the control gate being configured to be selectively coupled to a positive bias and one of the source and the drain being configured to be selectively coupled to a negative bias during a program operation, and the positive and negative biases being less than a maximum voltage limit of input/output (I/O) transistors used in the common logic.

2. The non-volatile memory cell of claim 1, further comprising: an under-lapped source region disposed between the channel region and the source.

3. The non-volatile memory cell of claim 1, wherein the ONO gate dielectric comprises:
   a blocking oxide layer underlying the control gate;
   a nitride layer underlying the blocking oxide layer; and
   a tunneling oxide layer underlying the nitride layer and overlying the P-well.

4. The non-volatile memory of claim 1, wherein the n-doped layer is a deep N-well disposed in a P-substrate.

5. The non-volatile memory cell of claim 1, wherein the n-doped layer is an N-substrate.

6. The non-volatile memory cell of claim 2, further comprising an under-lapped drain region disposed between the channel region and the drain.

7. The non-volatile memory cell of claim 1, wherein the control gate is configured to be selectively coupled to the negative bias and the one of the source and the drain is configured to be selectively coupled to the positive bias during an erase operation.

8. The non-volatile memory cell of claim 1, further comprising: an access transistor having a source coupled to the drain of the SONOS transistor.

9. A method comprising:
   fabricating a non-volatile memory cell along with at least one other device utilizing a single additional gate-dielectric mask, the fabrication process of the non-volatile memory cell comprising:
      creating an n-doped layer in a silicon substrate;
      creating a p-well in the n-doped layer;
      creating an NMOS transistor in the p-well, the NMOS transistor including a source and a drain on either side of a channel region thereof; and creating an ONO gate dielectric overlying the p-well.

10. The method of claim 9, further comprising:
    depositing a single-layer of one of a poly-silicon and a metal simultaneously on the gate dielectric of the NMOS transistor and on the gate dielectric of logic transistors.

11. The method of claim 9, further comprising:
    disposing an under-lapped source region between the channel region and the source; and
    disposing an under-lapped drain region between the channel region and the drain.

12. The method of claim 9, further comprising:
    blocking deposition of a lightly-doped diffusion implant on either side of the channel region so as to create a more abrupt source and drain junction between the channel region and an N+ region of the source and between the channel region and an N+ region of the drain.

13. The method of claim 9, wherein creating the ONO gate dielectric comprises:
    depositing a tunnel oxide layer overlying the p-well;
    depositing a nitride layer overlying the tunnel oxide layer; and
    depositing a blocking oxide layer overlying the nitride layer.

14. A method comprising:
    creating a non-volatile memory cell through:
       creating an N-well in a P-type silicon substrate;
       creating a P-well in the N-well;
       creating an NMOS transistor in the P-well, the NMOS transistor including a source and a drain on either side of a channel region thereof; and
       creating an ONO gate dielectric overlying the P-well;
    creating common logic components on the same substrate as the non-volatile memory cell through at least all steps required in a same common logic process; and
    utilizing a single additional gate-dielectric mask to mask the common logic components to mask deposition of the ONO gate dielectric.

15. The method of claim 14, further comprising:
    depositing a single-layer of one of a poly-silicon and a metal on the gate dielectric to form a gate for each of the transistors simultaneously.

16. The method of claim 14, further comprising:
    disposing an under-lapped source region between the channel region and the source; and
    disposing an under-lapped drain region between the channel region and the drain.

17. The method of claim 14, further comprising providing an access transistor having a source coupled to the drain of the NMOS transistor.

18. The method of claim 14, further comprising:
    blocking deposition of a lightly-doped diffusion implant on either side of the channel region so as to create a more abrupt source and drain junction between the channel region and an N+ region of the source and between the channel region and an N+ region of the drain.

19. The method of claim 14, wherein creating the ONO gate dielectric comprises:
    depositing a tunnel oxide layer overlying the P-well;
    depositing a nitride layer overlying the tunnel oxide layer; and depositing a blocking oxide layer overlying the nitride layer.

20. The method of claim 14, further comprising:
arranging the non-volatile memory cell along with other non-volatile memory cells in rows and columns to form a memory array.

21. An integrated circuit comprising:
at least one logic component having a gate; and
a non-volatile memory cell coupled to the at least one logic component, the non-volatile memory cell also including a gate, the gate of the at least one logic component and the gate of the non-volatile memory cell each having one of: a poly-silicon and a metal common single-layer gate structure, the logic component being created on a same substrate as the non-volatile memory cell through at least all steps required in a common logic process, and a single additional gate-dielectric mask being utilized to create the non-volatile memory cell.

22. The integrated circuit of claim 21, wherein the non-volatile memory cell further comprises an under-lapped source region of a transistor thereof disposed between a channel region and a source of the transistor and an under-lapped drain region of the transistor disposed between the channel region and a drain of the transistor.

23. The integrated circuit of claim 21,
wherein the non-volatile memory cell is disposed in a P-well that is, in turn, disposed on an n-doped layer of silicon,
wherein the non-volatile memory cell includes an ONO gate dielectric disposed on the P-well, and
wherein the non-volatile memory cell includes a drain and a source coupled by a channel region.

24. The integrated circuit of claim 23, further comprising:
an access transistor coupled to the non-volatile memory cell to reduce any disturbance from an erase or a read operation on the non-volatile memory cell, the drain of the non-volatile memory cell being coupled to a source of the access transistor.

25. The integrated circuit of claim 21, wherein the non-volatile memory cell and other non-volatile memory cells thereof are arranged in rows and columns to form a memory array.

26. The integrated circuit of claim 25, further comprising:
a bit line coupled to a drain of each non-volatile memory cell located in a given column;
a common line coupled to a source of the each non-volatile memory cell in the given column; and
a word line coupled to a gate of each access transistor of the non-volatile memory cells in a given row.

27. The integrated circuit of claim 23, wherein the non-volatile memory cell is located in at least one configuration comprising: a common deep P-well, and a common n-doped layer.

28. A method of fabricating an integrated circuit having common logic and non-volatile memory, the method comprising:
creating an n-doped layer in a silicon substrate;
creating a p-well in the n-doped layer;
creating a source and a drain region for transistors in both the common logic and the non-volatile memory using a common logic process;
creating an ONO gate dielectric for the non-volatile memory using a single additional gate-dielectric mask; and
utilizing a same logic process to fabricate both the common logic and the non-volatile memory, except for the utilization of the single additional gate-dielectric mask.

29. The method of claim 28, further comprising:
depositing concurrently a single-layer of: one of a poly-silicon and a metal as a gate for both transistors of the common logic and transistors of the non-volatile memory using the common logic process.

* * * * *